United States Patent
Kondo et al.

(10) Patent No.: US 6,885,556 B2
(45) Date of Patent: Apr. 26, 2005

(54) ELECTRONIC APPARATUS (75) Inventors: Yoshihiro Kondo, Tsuchiura (JP); Shinji Matsushita, Ebina (JP); Shigeo Ohashi, Tsuchiura (JP); Takashi Naganawa, Tsuchiura (JP); Rintaro Minamitani, Tsuchiura (JP); Tsuyoshi Nakagawa, Tsuchiura (JP); Yuuji Yoshitomi, Tsuchiura (JP); Masato Nakanishi, Tsuchiura (JP); Hajime Katou, Tsuchiura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/874,232

(22) Filed: Jun. 24, 2004

(65) Prior Publication Data
US 2004/0228092 A1 Nov. 18, 2004

Related U.S. Application Data (63) Continuation of application No. 10/239,155, filed as application No. PCT/JP02/07008 on Jul. 10, 2002, now Pat. No. 6,757,169.

(30) Foreign Application Priority Data

Sep. 4, 2001 (JP) ...................................... 2001-266654

(51) Int. Cl.⁷ ............................................... H05K 7/20
(52) U.S. Cl. ...................... 361/699; 361/689; 361/698; 174/15.1; 174/17 LF; 165/80.4; 62/259.2
(58) Field of Search .............................. 361/698–700; 257/714, 715; 174/15.1, 17 LF; 165/80.4, 104.33; 62/259.2

(56) References Cited

U.S. PATENT DOCUMENTS

| 3,989,102 | A | 11/1976 | Jaster et al. |
|---|---|---|---|
| 5,394,936 | A | 3/1995 | Budelman |
| 5,646,824 | A | 7/1997 | Ohashi et al. |
| 5,764,483 | A | 6/1998 | Ohashi et al. |
| 5,999,404 | A | 12/1999 | Hileman |
| 6,097,597 | A | 8/2000 | Kobayashi |
| 6,234,240 | B1 | 5/2001 | Cheon |
| 6,639,797 | B2 | 10/2003 | Saeki et al. |
| 2004/0109290 | A1 * | 6/2004 | Dunn et al. .................. 361/699 |

FOREIGN PATENT DOCUMENTS

| JP | 2-209685 | 8/1990 |
|---|---|---|
| JP | 3-208365 | 9/1991 |
| JP | 5-264139 | 10/1993 |
| JP | 5-312143 | 11/1993 |
| JP | 6-125188 | 5/1994 |
| JP | 6-266474 | 9/1994 |
| JP | 7-142886 | 6/1995 |
| JP | 9-268386 | 10/1997 |
| JP | 2001-024372 | 1/2001 |
| JP | 2001-142573 | 5/2001 |
| JP | 2002-014747 | 1/2002 |

* cited by examiner

Primary Examiner—Boris Chervinsky
(74) Attorney, Agent, or Firm—Antonelli, Terry, Stout & Kraus, LLP (57) ABSTRACT

An electronic apparatus includes a case mounting a semiconductor element within an inside thereof, a heat-receiving member thermally connected with the semiconductor element, a heat-radiation member disposed on an inner side surface of the casing, and a liquid driver for driving a liquid coolant between the heat-radiation member and the heat-receiving member. The apparatus further includes a tank accumulating the liquid coolant therein with at least a predetermined volume of the coolant to delimit a coolant surface within the tank, wherein the tank, the heat-radiation member and the heat-receiving member are connected with tubes, and a suction end portion of a suction pipe connected into the tank is located at a position which is always below the coolant surface irrespective of change of position of the tank.

6 Claims, 11 Drawing Sheets

ELECTRONIC APPARATUS

CROSS REFERENCE TO RELATED APPLICATION

This is a continuation of U.S. application Ser. No. 10/239,155, filed May 6, 2003 now U.S. Pat. No. 6,257,169, the subject matter of which is incorporated by reference herein and is a 371 of PCT/JP02/07008, filed Jul. 10, 2002.

TECHNICAL FIELD

The present invention relates to an electronic equipment or apparatus, in which a semiconductor element is cooled through a liquid circulating therein.

BACKGROUND ART

Conventional electronic equipment or apparatus, including a water-cooling device therein and also being portable, is already known, for example, in Japanese Patent Laying-Open No. Hei 7-142886 (1995), and Japanese Patent Laying-Open No. 2001-24372 (2001).

Also, an electronic apparatus is already known, relating to the conventional art, in which a tank is disposed within a piping system of a water-cooling module for cooling a heat-generating part thereof, for example, in Japanese Patent Laying-Open No. Hei 6-125199 (1994), and Japanese Patent Laying-Open No. Hei 9-268386 (1997).

In addition thereto, the conventional structure is also already known, in which a pump will not suck the air into, in spite of fluctuation of the water surface within a tank, for example, in Japanese Patent Laying-Open No. Hei 2-209685 (1990), and Japanese Patent Laying-Open No. Hei 5-312143 (1993).

In particular, as is shown in the Japanese Patent Laying-Open No. Hei 5-312143 (1993) mentioned above, in a fuel tank for use in an automobile, etc., for the purpose of prohibiting mixing of the air therein, a discharge port of a submerged pump, to which is attached a float, and a filter are connected within the liquid receiver tank, thereby being movable vertically following the liquid surface within the tank.

However, none of those conventional arts takes into the consideration, of mixing of the air when the tank is moved (i.e., being turned upside down).

Namely, with the conventional arts mentioned above, there may be a fear that the pump may suck a gas, such as the air, when operating. In this instance, in particular, in a case where it is applied into a water-cooling system for the electronic apparatus relating to the present invention, there may occur a problem that performance comes down remarkably, in cooling, therefore the cooling cannot be achieved fully for the heat-generating element.

DISCLOSURE OF THE INVENTION

An object is, therefore, according to the present invention, by taking such the drawbacks of the above-mentioned conventional arts into the consideration, to provide an electronic equipment or apparatus, in particular, a portable (movable) and small-sized electronic equipment or apparatus, being able to deal with an increase of heat-generation from the heat-generating element accompanying with an improvement in processing performance thereof in recent years, wherein a stable cooling can be obtained by circulating and/or supplying a liquid coolant with stability therein.

The object mentioned above can be achieved by, according to the present invention, first of all, an electronic apparatus, comprising: a case mounting a semiconductor element within an inside thereof; a heat-receiving member being thermally connected with said semiconductor element; a heat-radiation member disposed on an inner side surface of said casing; a liquid driving means for driving a liquid coolant between said heat-radiation member and said heat-receiving member; and a tank accumulating said liquid coolant therein, wherein said tank, said heat-radiation member and said heat-receiving member are connected with tubes, and a suction end portion of a suction pipe connected into said tank is located at such positioned, that it will not exposed from a water surface irrespective of change on the water surface within said tank.

Also, the object mentioned above can be achieved, according to the present invention, by an electronic apparatus, comprising: a first case mounting a semiconductor element within an inside thereof; a second case receiving a display device in an inside thereof and being rotatably supported with said first case; a heat-receiving member being thermally connected with said semiconductor element; a heat-radiation member disposed on an inner side surface of said second casing; a liquid driving means for driving a liquid coolant between said heat-radiation member and said heat-receiving member; and a tank accumulating said liquid coolant therein, wherein said tank, said heat-radiation member and said heat-receiving member are connected with tubes, and a suction end portion of a suction pipe connected to said tank is located at around a central portion of said tank.

Further, the object mentioned above can be achieved, according to the present invention, by the electronic apparatus, as described in the above, wherein an inside of said tank is divided into three chambers by means of two (2) pieces of partition plates, and said suction end portion of said suction pipe is located within the chamber middle in said three (3) chambers.

Further, the object mentioned above can be achieved, according to the present invention, by the electronic apparatus, as described in the above, wherein a gap is provided between an inner surface of said tank and each of said partition plates, whereby bringing said three (3) chambers to be communicated with one another.

And, also the object mentioned above can be achieved, according to the present invention, by the electronic apparatus, as described in the above, wherein said tube connecting into said tank has a flow inlet and a flow outlet, and a nozzle for injecting said liquid coolant through pushing out air within said tube is able to connect to said flow inlet and said flow outlet.

BEST MODE FOR CARRYING OUT THE INVENTION

An electronic equipment or apparatus, such as a so-called personal computer, includes a notebook-type personal computer, which is portable, and a desktop-type personal computer, which is mainly used on a desk. With each of those personal computers, being demanded to be higher and larger in processing speed and capacity thereof every year, temperature of the heat generation of a CPU, i.e., the semiconductor element, comes up to be higher, as a result of those requirements. And it is expected that this tendency will continue further, in future.

On the contrary to this, in general, the personal computers are mainly of an air-cooling type by means of a fan or the like, or a heat or thermo-conductive type, at the present situation. Those cooling method have a limit in the capacity of heat-radiation, and there is a possibility that they cannot follow the heat-radiation of the CUP, which is on such the tendency of high heat-generation, as was mentioned above. However, it may be possible to treat with this, by making the fan rotating at higher speed and/or larger in the size thereof, however it brings about an effect against requirements for the personal computer, such as low-noise generation and/or light-weighting, therefore it is not a realistic solution.

On the other hand, as a method for heat-radiation, to be replaced with heat-radiation of the conventional air-cooling type, there is an apparatus adopting a device for cooling the CPU, by circulating a cooling medium or coolant, such as water, etc.

Such the cooling device is mainly used in a cooling system for a large-scaled computer, being located in a company or bank, etc., and wherein cooling water is circulated compulsively by means of a pump, and is cooled by a refrigerator for exclusive use thereof, thereby being large in the scale or sizes thereof.

Accordingly, such the cooling device by means of water as was mentioned above is unable, at all, to be mounted into the notebook-type personal computer, which may be moved or carried with frequently, and into the desk-top personal computer, which also may be moved due to, such as re-arrangement in an office, etc., even if this cooling device can be made small in the sizes, for example.

Then, as was in the conventional arts mentioned above, various devices are studied, for achieving the cooling through the water, which can be mounted on a small-sized personal computer, however the temperature of heat-generation by the semiconductor element was not so high as in the recent year, at the time when such the conventional arts were made and filed as the patent applications, therefore no personal computer equipped with the water-cooling device comes out available on markets as an actual product, until up to now.

On the contrary to this, according to the present invention, small-sizing of the water-cooling device can be achieved, drastically, by building up the case defining an external form of the main body of a computer, from aluminum alloy or magnesium alloy, etc., being superior in heat-radiation, thereby enabling the water-cooling device to be amounted onto the personal computer.

However, it comes to be appear that a tank is necessary for accumulating the water, for the water-cooling device to be mounted into the main body of the personal computer, and that the tank brings about a large ill effect when the personal computer is moved or carried with.

Thus, due to the movement of the tank accompanying with or depending on that of the personal computer, also the water surface within the tank changes, and if the water surface comes down lower than the outlet or exit of liquid, in a case, the water will not be circulated, therefore causes a problem that the cooling of the semiconductor element cannot be obtained. This phenomenon is remarkable, in particular, for the notebook-type personal computer, which may be moved under the condition of turning ON the power source thereof with high provability.

Also, there is a problem that the water permeates from the pipe itself, being made from a flexible tube, etc., therefore the water levels comes down.

Then, according to the present invention, there is provided an electronic equipment or apparatus, adopting a water-cooling apparatus or device, in which the water surface will not come down lower than the outlet or exit of liquid within the tank, regardless of the movements of the personal computer in any direction (or being located in any disposition)

Hereinafter, explanation will be given in more detail on an embodiment according to the present invention, by referring to FIGS. 1 to 22 attached. However, in the present embodiment, the explanation will be given, in particular, about the notebook-type personal computer, as an example of the electronic apparatus, according to the embodiment of the present invention.

Figure 1:
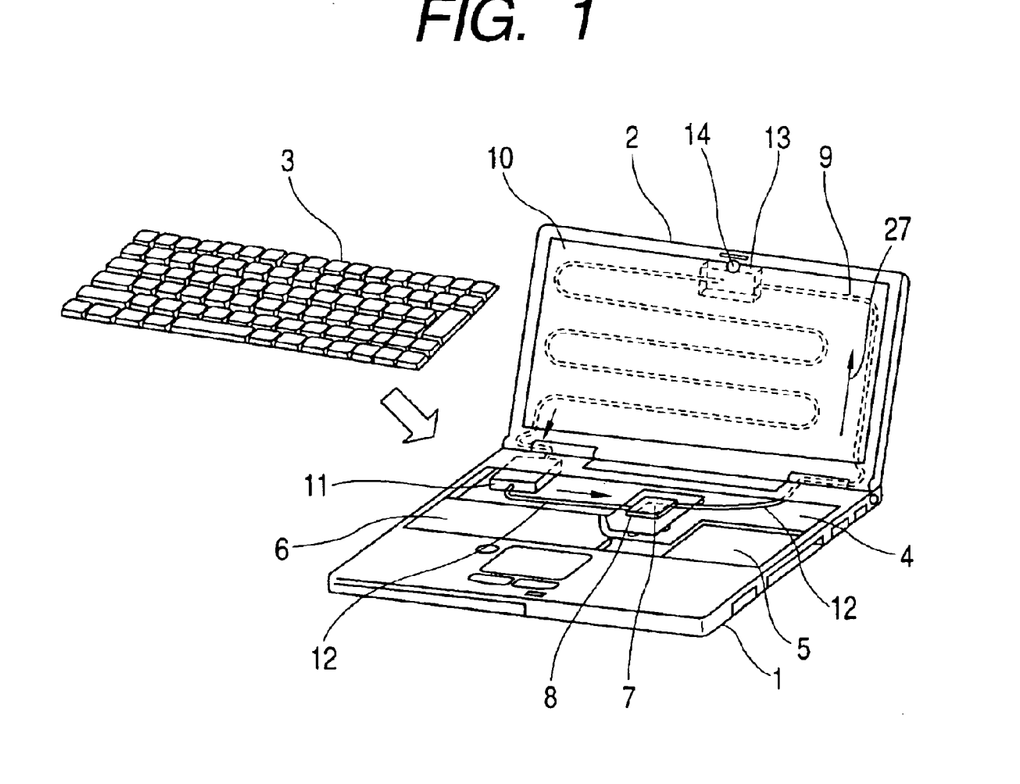
FIG. 1 is a perspective view for showing an electronic equipment or apparatus, according to an embodiment of the present invention.

In FIG. 1, the electronic apparatus comprises a main case 1 and a display case 2 having a display thereon, and on the main case 1 is attached a keyboard 3, while within an inside thereof being provided or mounted a wiring or circuit board 4 mounting a plural number of elements, a hard-disk drive 5, an auxiliary memory device (such as, a floppy-disk drive, a CD drive, etc., for example) 6, etc. On the wiring or circuit board 4 is mounted a semiconductor element, in particular having a large amount of heat-generation, such as a central processing unit (hereinafter, being called by "CPU") 7 or the like.

Onto this CPU is attached a water-cooling jacket 8. The CPU 7 and the water-cooling jacket 8 are connected with each other, through a soft thermo-conductive material (for example, mixture of Si rubber and thermo-conductive filler of aluminum oxide, etc.) therebetween. Also, on a rear surface of the display case 2 (i.e., in an interior side of the case) are provided a metal heat-radiation plate 10, onto which a heat-radiation pipe 9 is connected.

However, building up the display case 2 itself from a metal (for example, aluminum alloy, magnesium alloy, etc.) may eliminate the metal heat-radiation plate 10, or the heat-radiation pipe 9, thereby they can be connected on the display case 2, directly.

Also, within the main case 1 is provided a pump 11, as a liquid transportation means, and a reservoir tank 13 is provided within the display case 2, for accumulating the cooling water therein. Those water-cooling jacket 8, the heat-radiation pipe 9, the pump 11, and the reservoir tank 13 are connected with one another, through flexible tubes 12, respectively, and with this, the cooling liquid (for example, the water, an anti-freezing solution or fluid, etc.) enclosed in an inside thereof can be circulated by means of the pump 11. Further, a reference numeral 14 in the figure depicts a cover for closing a water supply port provided on the reservoir tank, the more details of which will be mentioned later. Also, a reference numeral 27 is an arrow for indicating the direction of the liquid.

Heat generated within the CPU 7 is transferred to the cooling water communicating within the water-cooling jacket 8, and thereafter is radiated into the air outside, from the metal heat-radiation plate 10 disposed on the rear surface of the display through the surface of the display case 2, during when it passes through the heat-radiation pipe 9. The cooling water, which is lowered in temperature thereof in the above, is sent out to the water-cooling jacket 8 through the pump 11, again.

Figure 2:
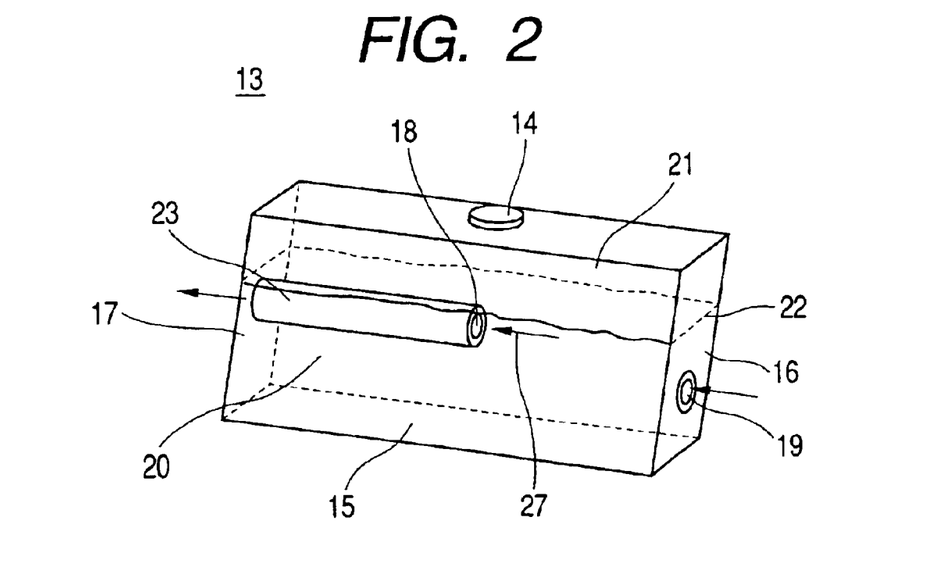
FIG. 2 is a perspective view for showing an outlook of the structure of a reservoir tank applied in the electronic equipment or apparatus mentioned above.

FIG. 2 is a perspective view for showing the outlook structure of the reservoir tank connected to the water-cooling system, for use in the notebook-type personal computer, as the electronic apparatus mentioned above.

In FIG. 2, in the reservoir tank 13 are defined a liquid or fluid region 20 of the cooling water, a gas region 21, and a boundary 22 (the water surface) therebetween, on which is attached a cover 14 for closing up an opening for use in injection of cooling water. Further, on the right-hand side surface 16 directing to the front surface 15 of the electronic equipment or apparatus shown in FIG. 1, an opening of the pipe is provided, as a flow inlet 19 (the portion onto which the heat-radiation pipe 9 from the water-cooling jacket 8 is connected). Also, on the left-hand side surface 17 is provided a hollow pipe 23, which has a flow outlet 18. However, the flow direction 27 of the liquid runs from the flow inlet 19 towards the flow outlet 18. And, the hollow pipe 23 of the flow outlet 18 is extended up to a center of the reservoir tank 13, as shown in the figure.

FIGS. 3(a) to 3(d) are four plane views, including a left-hand side view, a front view, a right-hand side view and a bottom side view, respectively, for showing the condition of the reservoir tank mentioned above, when the electronic apparatus performs a normal operation.

In those FIGS. 3(a) to 3(d), the display of the electronic apparatus stands up vertically, in the position thereof, when being operated under the normal condition. Thus, seeing from the front side 15 shown in FIG. 3(b), the hollow pipe 23 extends up to the central portion of the reservoir tank 13. Since the boundary surface 22, i.e., the water surface lies upper the hollow pipe 23 in the position thereof, therefore from the reservoir tank 13 can flow out only the cooling water, but without discharging the air therefrom, via the pump 11. Namely, it is possible to supply the cooling water with a stable flow amount in the water-cooling system. However, the position of the flow outlet 19 is indicated in the bottom portion on the right-hand side surface 16 shown in FIG. 3(c), in the present example, but it should not limited only to this, and may be provided on any surface and in any location.

FIGS. 4(a) to 4(d) show the condition of the reservoir tank where the electronic apparatus is fully opened, i.e., the display of the notebook-type personal computer is opened by 180 degree in the angle.

With advancing in the co-called mobile type of the electronic equipment or apparatus, in particular, for the notebook-type computer, cases of being used in a car or on a knee are increased. In those cases, it is used while being opened by 180 degree in the angle, sometimes. FIGS. 4(a) to 4(d) show the position of the boundary surface 22 defined between the fluid region 20 and the gas region 21 in the reservoir tank 13, in such the cases.

Figure 3A:
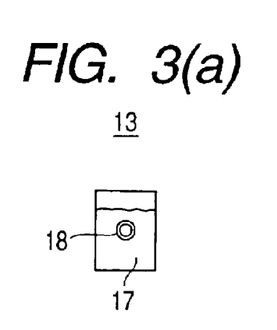
FIGS. 3(a) to 3(d) are four plane views (including both side views, a front view, and a bottom view) for showing the details of the reservoir tank mentioned above, under the condition of an ordinary operation of the electronic equipment or apparatus.
Figure 3B:
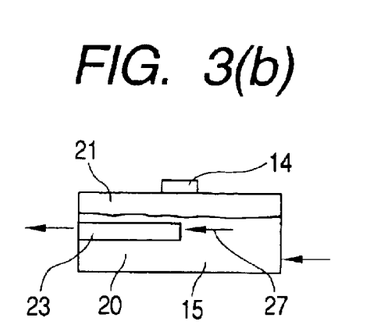
Figure 3C:
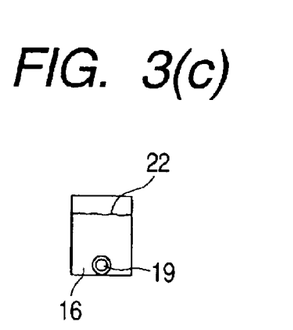
Figure 3D:
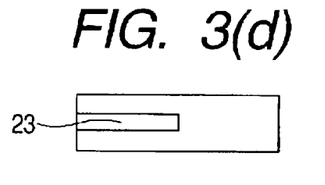

As shown in FIGS. 4(a) to 4(d), there can be seen the boundary surface 22, being different from the boundary surface 22 which can be seen on the both side surfaces shown in FIGS. 3(a) and 3(c) mentioned above. Even in those cases, the hollow tube 23 as the flow outlet 18 of the cooling water lies still below the water surface. Accordingly, form the reservoir tank 13 can flow out only the cooling water, without discharging the air therefrom, by means of the pump 11, thereby achieving supply of the cooling water with a stable amount thereof, in the water-cooling system.

Figure 4A:
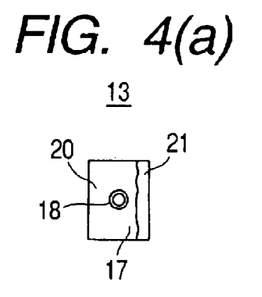
FIGS. 4(a) to 4(d) are four plane views (including both side views, a front view, and a bottom view) for showing the details of the reservoir tank mentioned above, under the condition of full-open of the electronic equipment or apparatus.
Figure 4B:
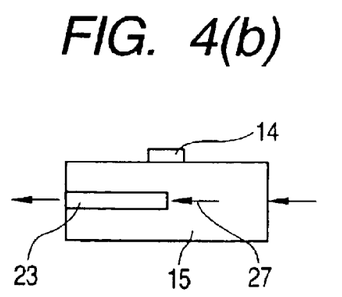
Figure 4C:
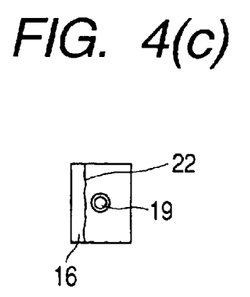
Figure 4D:
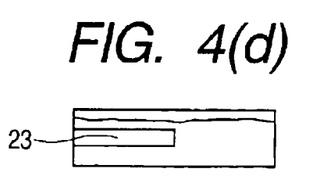

However, in the similar manner of the case shown in FIGS. 3(a) to 3(d) mentioned above, though the flow inlet 19 is located at the central portion on the right-hand side surface 16 shown in FIG. 4(c), but also, it may be located in any side surface and in any position.

By the way, there is a large difference in the environment or manner of use of the notebook-type personal computer, depending upon the difference of an individual or in the countries, and there are cases where it is handled under rather hard condition.

For instance, it is said, in many cases the notebook-type personal computer is used continuously as it is in a car, after being folded up the display under the condition of use on a desk to be moved or carried with, in particular overseas. This can be considered to come up, in a sense of eliminating the time for booting-up (start) and/or exiting (end) of the OS. Accordingly, for the electronic equipment or apparatus, including the notebook-type personal computer therein, it must be designed or devised with assumption of every carrying mode thereof.

Then, according to the present invention, the conditions of the reservoir tank are shown in FIGS. 5(a) to 7(d), corresponding to the special carrying modes where the notebook-type personal computer is moved or carried with under the turn-ON condition of the power source thereof.

Figure 5A:
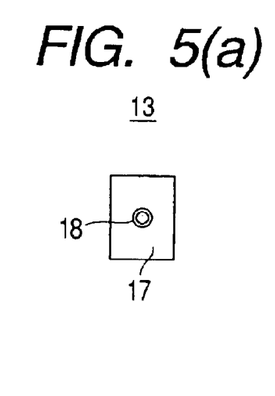
FIGS. 5(a) to 5(d) are four plane views (including both side views, a front view, and a bottom view) for showing the details of the reservoir tank mentioned above, under the special condition of No. 1 of the electronic equipment or apparatus.
Figure 5B:
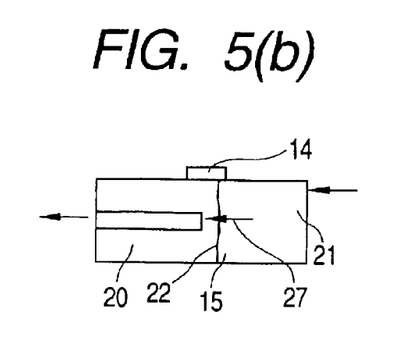
Figure 5C:
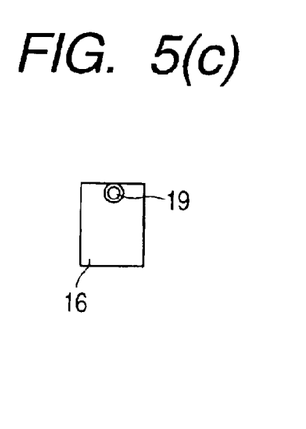
Figure 5D:
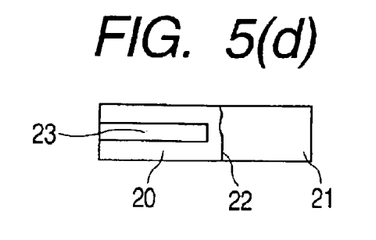

First, FIGS. 5(a) to 5(d) show the various plane views of the reservoir tank when the notebook-type personal computer is turned back the display (i.e., the condition of being folded), and in this case, the computer is carried with, directing the right-hand side surface of the tank shown in FIG. 5(c) upwards.

In those figures, the boundary surface between the fluid region 20 and the gas region 21 can be seen on the front surface shown in FIG. 5(b). Even in this case, the hollow tube 23, i.e., the flow outlet 18 of the cooling water lies below the water surface. Accordingly, from the reservoir tank 31 can flow out only the cooling water, without discharging the air, thereby supplying the cooling water with a stable amount in the water-cooling system.

However, though the flow outlet 19 can be seen in an upper portion on the right-hand side surface in FIG. 5(c) in the position thereof, in this case, but it may be located in any side surface and in any position.

Figure 6A:
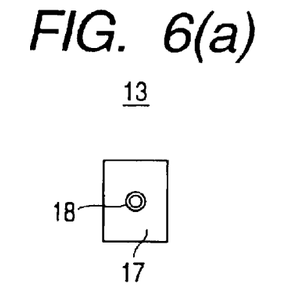
FIGS. 6(a) to 6(d) are four plane views (including both side views, a front view, and a bottom view) for showing the details of the reservoir tank mentioned above, under the special condition of No. 2 of the electronic equipment or apparatus.

FIGS. 6(a) to 6(d) also show, in the similar manner as in FIGS. 5(a) to 5(d), the plane views of the reservoir tank when the computer is turned back the display (i.e., the condition of being folded), but being different therefrom, in the case where the computer is carried, directing the left-hand side surface of the tank shown in FIG. 6(a) upwards.

Figure 6B:
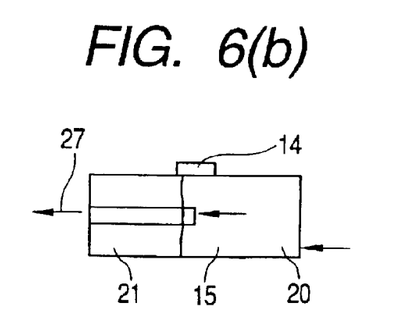

In those FIGS. 6(a) to 6(d), in the similar manner to the case shown in FIGS. 5(a) to 5(d), the boundary surface 22 can be seen on the front surface shown in FIG. 6(b). Even in this case, the hollow tube 23, i.e., the flow outlet 18 of the cooling water lies below the water surface. Accordingly, from this reservoir tank 13 can flow out only the water, without discharging the air, thereby supplying the cooling water with a stable amount in the water-cooling system. Further, in such the situation, it is rare or seldom that the computer is under the condition of turning the power source ON, therefore being very small in possibility of bringing about thermal runaway of the CPU.

Figure 6C:
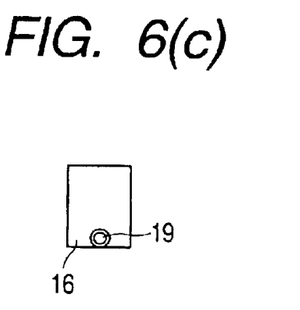
Figure 6D:
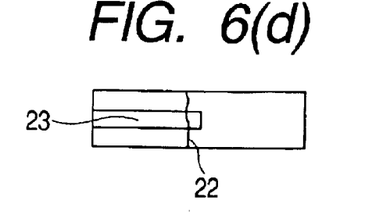

However, though the flow outlet 19 is located in an upper portion on the right-hand side surface shown in FIG. 6(c) in the position thereof, in this case, but it also may be located in any side surface and in any position.

FIGS. 7(a) to 7(d) show various plane views of the reservoir tank 13, in the case, being different from those shown in FIGS. 6(a) to 6(d) and FIGS. 5(a) to 5(d) mentioned above, where the boundary surface 22 between the fluid region 20 and the air region 21 is inclined or tilted. This may be a case of an assumption, where the notebook-type personal computer is carried by a hand, or is left in a car, under the condition that the display thereof is folded and inclined.

Figure 7A:
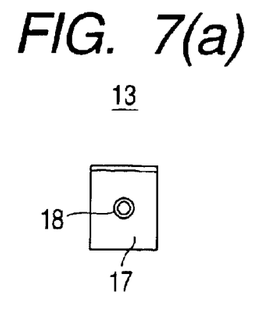
FIGS. 7(a) to 7(d) are four plane views (including both side views, a front view, and a bottom view) for showing the details of the reservoir tank mentioned above, under the special condition of No. 3 of the electronic equipment or apparatus.
Figure 7B:
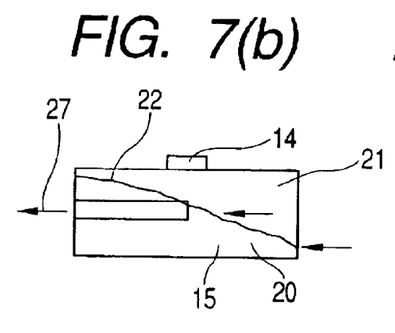
Figure 7C:
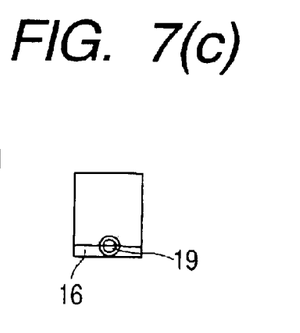
Figure 7D:
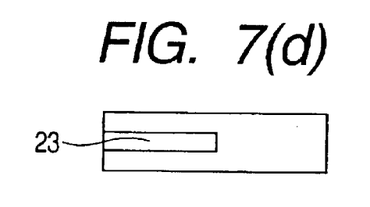

In FIGS. 7(a) to 7(d), the boundary surface 22 appears on the front surface 15 shown in FIG. 7(b), however the same can be said when this appears on the right-hand side surface 16 shown in FIG. 7(c) or on the left-hand side surface 17 shown in FIG. 7(a). However, even if the boundary surface 22 is tilted, the hollow tube 23, i.e., the flow outlet 18 of the cooling water lies below the water surface. This condition of the boundary surface 22 being inclined occurs, mainly when the electronic equipment or apparatus is moved or carried with. In this instance, the case of so-called a sloshing can be included, where the surface changes in waveform-like.

Accordingly, even in the case where the boundary surface 22 is inclined, the pump 11 can flow out only the water, without discharging the air, thereby obtaining supply of the cooling water with a stable amount in the water-cooling system. However, though the flow outlet 19 is located in a lower portion on the right-hand side surface in FIG. 7(c) in the position thereof, in this case, but it also may be located in any side surface and in any position.

Figure 8:
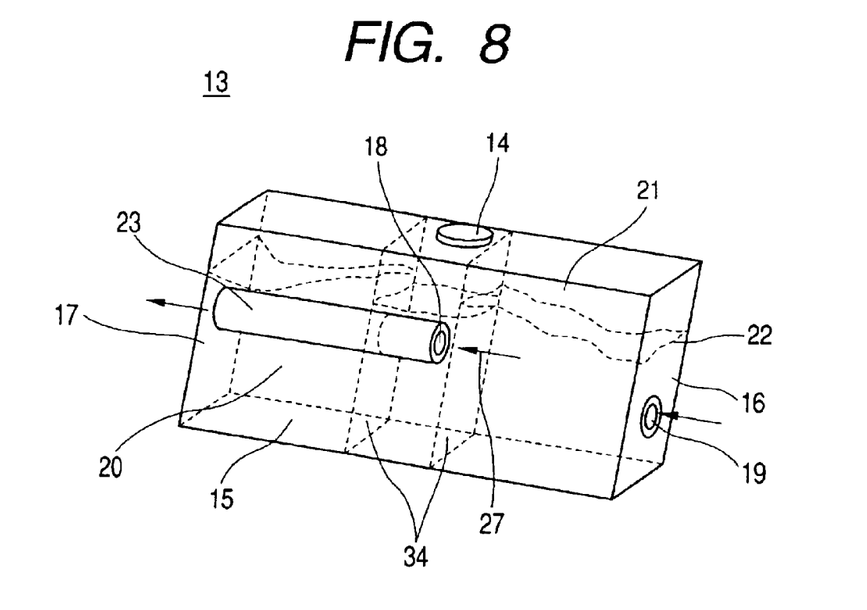
FIG. 8 is a perspective view for showing an outlook of other (i.e., a second) example of the reservoir tank, which is applied in the electronic equipment or apparatus mentioned above.

Next, FIG. 8 shows an outlook of the reservoir tank 13, being applied in the electronic equipment or apparatus mentioned above, according to other (i.e., a second) example.

In this FIG. 8, being different from the example shown in FIG. 2 in the above, two (2) pieces of partition plates 34 are provided in the vicinity of the flow outlet 18 in the reservoir tank 13. Those partition plates 34 are attached onto the front surface 15, and bring about an effect of increasing the strength of the reservoir tank 13, as well as the following ones.

According to those two (2) pieces of the partition plates 34, first of all, the movement of the boundary surface 22 defined between the fluid region 20 and the gas region 21 can be reduced, when the electronic equipment or apparatus is moved or carried with. This is because the boundary surface 22 is divided by the partition plates, thereby being lessened in fluctuation on the boundary surface 22 in the vicinity of the flow outlet 18. With this, from the reservoir tank 13 can flow out only the water, but without discharging of the gas, thereby enabling the supply of the cooling water with a stable flow amount in the water-cooling system.

FIGS. 9(a) to 9(d) are various plane views of the reservoir tank shown in FIG. 8 in the above, and in particular, showing the condition where the electronic equipment or apparatus is operated on a desk, i.e., under the ordinary using condition (with standing up the display).

Figure 9A:
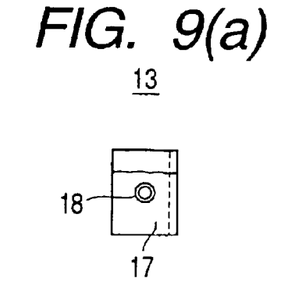
FIGS. 9(a) to 9(d) are four plane views (including both side views, a front view, and a bottom view) for showing the details of the second reservoir tank mentioned above.
Figure 9B:
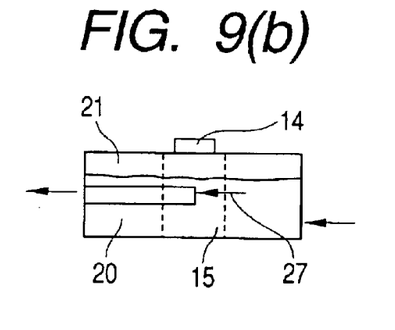
Figure 9C:
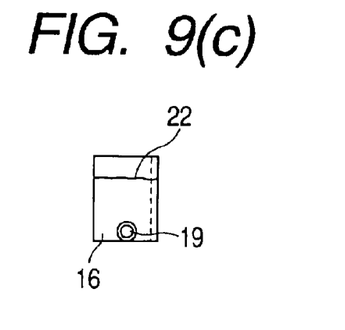
Figure 9D:
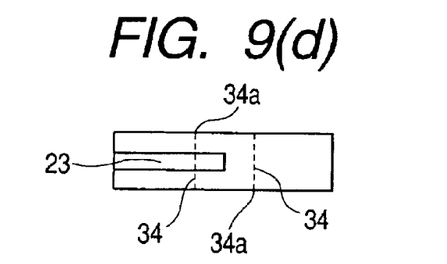

In FIGS. 9(a) to 9(d), though the two (2) pieces of the partition plates 34 are in a mode of dividing the vicinity of the outlet 18 of fluid, and in more detail, as being apparent from FIG. 9(d), one (1) piece of the partition plate 34 is fixed onto the front surface 15, but is separated by a certain gap 34a from the opposite surface thereof. Further, the other piece of the partition plate 34 is separated from the front surface 15 by a certain gap 34a, but is fixed onto the opposite surface thereof. With such fixing of the partition plates, the strength of the reservoir tank 13 can be enhanced. Also, as was mentioned in the above, with provision of the certain gap at one end of the partition plate, it is possible to suppress a large fluctuation on the boundary between the fluid region 20, i.e., the cooling water, and the gas region 21, i.e., the air, thereby making change or fluctuation smooth on the boundary surface 22 between them around the flow outlet 18.

Accordingly, the reservoir tank 13, in which the fluctuation in the vicinity of the outlet 18 of fluid can be lessened, can flow out only the cooling water, but without discharging of the air, thereby enabling the supply of the cooling water with a stable flow amount in the water-cooling system.

Figure 10:
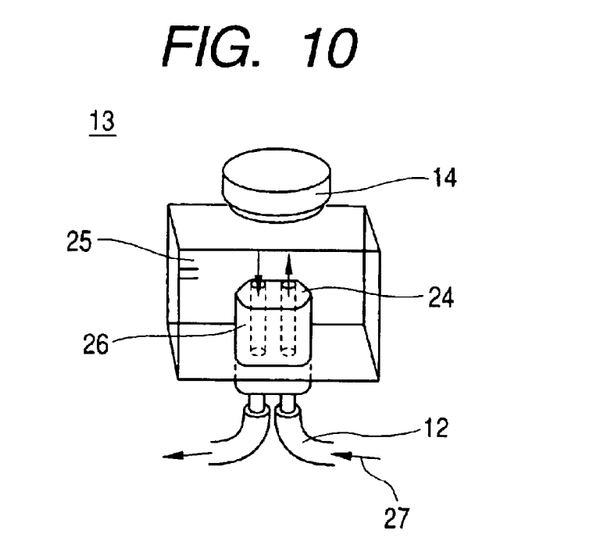
FIG. 10 is a perspective view for showing an outlook of further other (i.e., a third) example of the reservoir tank, which is applied in the electronic equipment or apparatus mentioned above.

Next, FIG. 10 attached is also a perspective view of the reservoir tank, which is applied to the electronic equipment or apparatus mentioned above, according to the further other (i.e., a third) example.

In this FIG. 10, on the reservoir tank 13 are provided an inlet/outlet 26 of fluid, a cover 14 for closing up a water supply opening on the reservoir tank 13, and a scale 25. The inlet/outlet 26 of fluid is connected with other parts of the water-cooling system through flexible tubes 12. On this inlet/outlet 26 of fluid is provided or formed a connection surface 24 with a liquid injection jig. This connection surface 24 is a part for achieving injection of the liquid (water) into a pipe. Further, flow direction 27 of fluid directs from a bottom portion towards the reservoir tank 13, as shown by arrows in the figure, and goes out into the direction of the bottom surface, in the mode.

Figure 11:
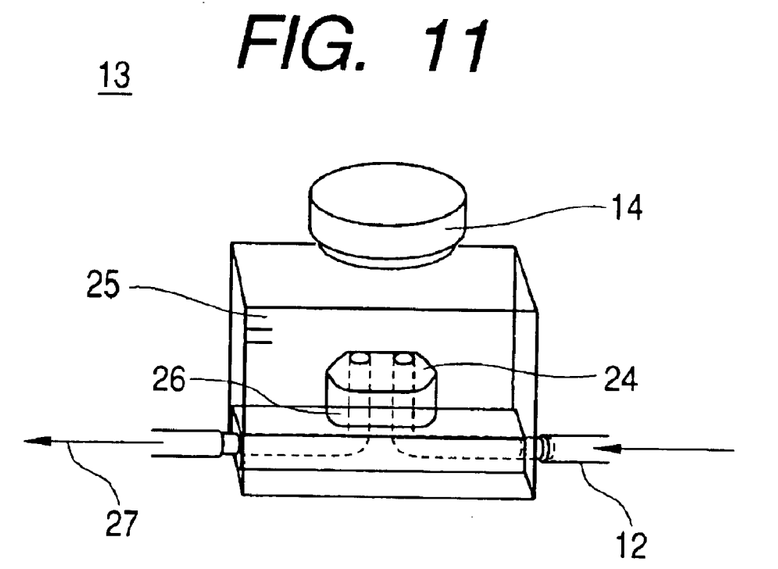
FIG. 11 is a perspective view for showing an outlook of further other (i.e., a fourth) example of the reservoir tank, which is applied in the electronic equipment or apparatus mentioned above.

Also, FIG. 11 is a perspective view, for briefly explaining the reservoir tank 13, which is applied in the electronic equipment or apparatus mentioned above, according to further other (i.e., a fourth) example.

In FIG. 11, differing from that shown in FIG. 10 mentioned above, the flow direction of fluid is as shown by arrows in the figure, i.e., it enters into the reservoir tank 13 from the right-hand side surface thereof and goes out from the left-hand side surface thereof, in the mode.

Figure 12:
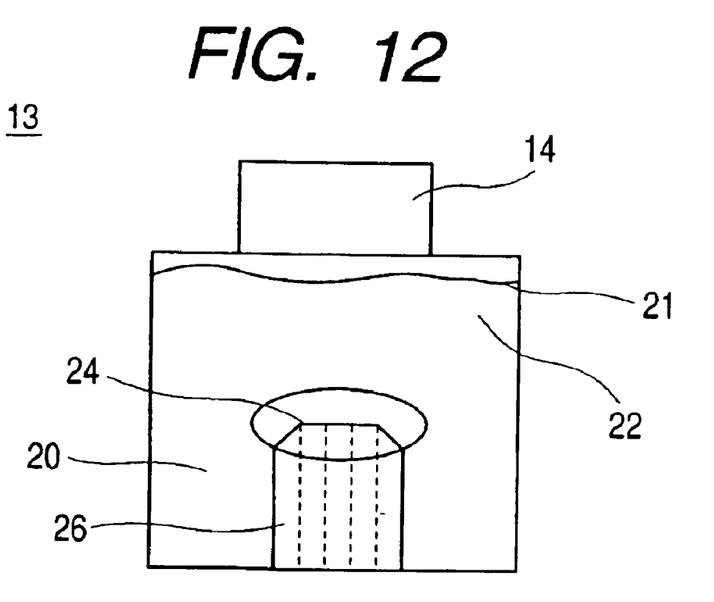
FIG. 12 is a view for showing the condition (the water level) of the reservoir tank mentioned above, when the electronic equipment or apparatus is under operation.

FIG. 12 shows the condition of the reservoir tank 13, explained in FIGS. 10 and 11 mentioned above, when the electronic equipment or apparatus is operated.

In FIG. 12, since a rubber tube made of high polymer group is used, generally in the water-cooling system for use in the electronic equipment or apparatus, therefore the coolant, i.e., cooling water permeates from this rubber tube to be discharged into the air in form of water vapor. In this instance, the air comes into this water-cooling system. Then, by taking the reduction amount of the cooling water into the consideration, such an amount of the cooling water is injected, that the connection surface 24 with the liquid injection jig does not come out from the boundary surface 22. With this, the reservoir tank 13 can flow out only the cooling water therefrom, but without discharging of the air, thereby being able to supply the cooling water into the water-cooling system with a stable flow amount.

Figure 13:
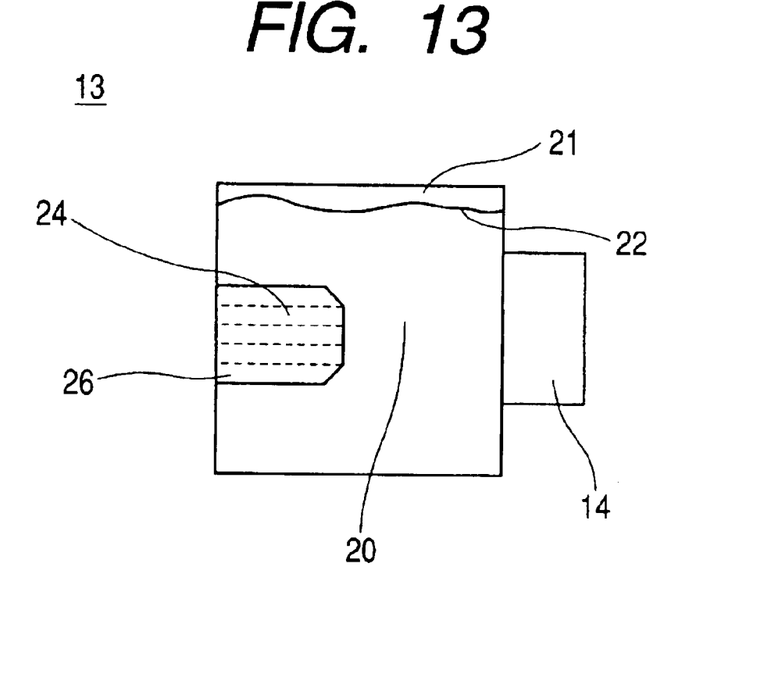
FIG. 13 is also a view for showing the condition (the water level) of the reservoir tank mentioned above, when the electronic equipment or apparatus is under operation.

FIG. 13 shows the reservoir tank 13 under the condition (the water level) of being inclined by 90 degree in the angle.

In this FIG. 13, in the similar manner to the case shown in FIG. 12 mentioned above, by taking the reduction amount of the cooling water into the consideration, such an amount of the cooling water is injected, that the connection surface 24 with the liquid injection jig does not come out from the boundary surface 22. With this, the reservoir tank 13 can flow out only the cooling water therefrom, but without discharging of the air, thereby being able to supply the cooling water into the water-cooling system with a stable flow amount.

Figure 14:
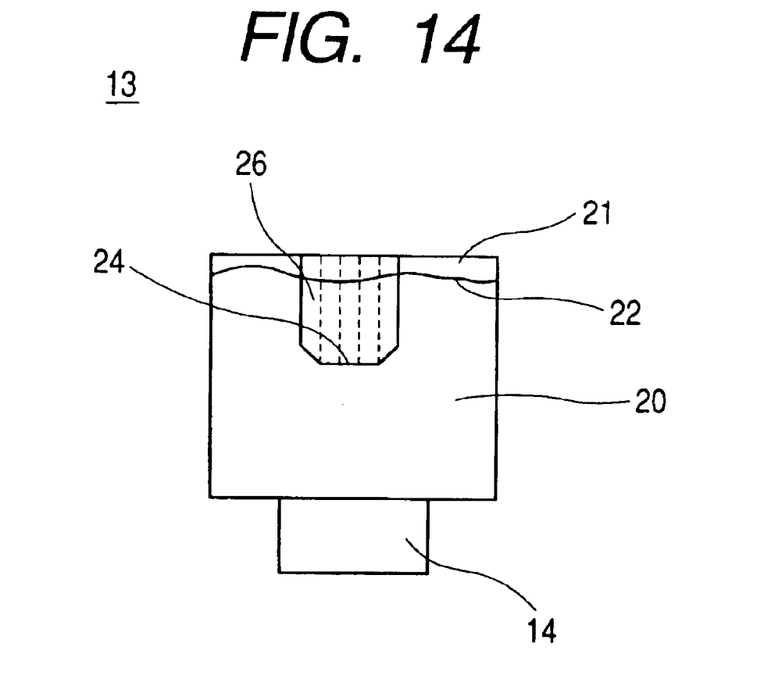
FIG. 14 is also a view for showing the condition (the water level) of the reservoir tank mentioned above, when the electronic equipment or apparatus is under operation.

FIG. 14 shows the reservoir tank 13 under the condition (the water level) of being inclined by 180 degree in the angle.

In this FIG. 14, also in the similar manner to the cases shown in FIGS. 12 and 13 mentioned above, by taking the reduction amount of the cooling water into the consideration, such an amount of the cooling water is injected, that the connection surface 24 with the liquid injection jig does not come out from the boundary surface 22. With this, the reservoir tank 13 can flow out only the cooling water therefrom, but without discharging of the air, thereby being able to supply the cooling water into the water-cooling system with a stable flow amount.

Figure 15:
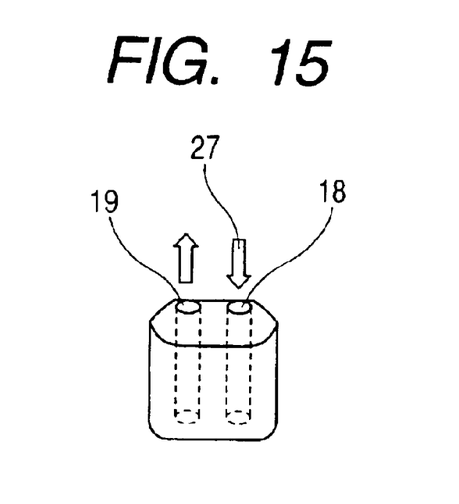
FIG. 15 is a view for showing the structure for inlet/outlet of a liquid within the reservoir tank mentioned above.

Further, FIG. 15 is a view for showing the structure of the inlet/outlet portion of the reservoir tank mentioned above.

In this FIG. 15, in order to prevent the air from entering into the flow inlet of liquid if the air is discharged from the outlet of liquid during the operation, the inlet/outlet portion is located in parallel with the flow inlet 19 of liquid. In this case, the air is accumulated in an upper portion of the reservoir tank 13. Also, the inlet/outlet portion is formed in such the shape, for example, in a tapered shape, so that it causes no misplace in the position with a hole of the liquid injection jig, which will be explained later. Further, the height of the inlet/outlet portion is set, so that no air is sucked even if the cooling water is reduced, and in more details, at the position around the center of the reservoir tank 13.

Then, in the water-cooling system mentioned above, the reservoir tank, the pump, the water-cooling jacket and the heat-radiation pipe are connected in series in that order or sequence, thereby building up the piping route hermetically enclosed. When injecting the water, or the like, into the route within such the hermetically enclosed piping, the injection of water is carried out, normally, by opening the cover 14 of the reservoir tank 13. However, the water cannot be distributed in the all routes due to only the injection of water.

Thus, the air fills up within the pipes of thin diameter in portions other than the reservoir tank 13, therefore the water is pushed out or back due to that air. Accordingly, after injecting the water into the reservoir tank, it is necessary to push out the air from the inside of the pipes by appropriate pressure, so as to communicate the water therethrough.

Figure 16:
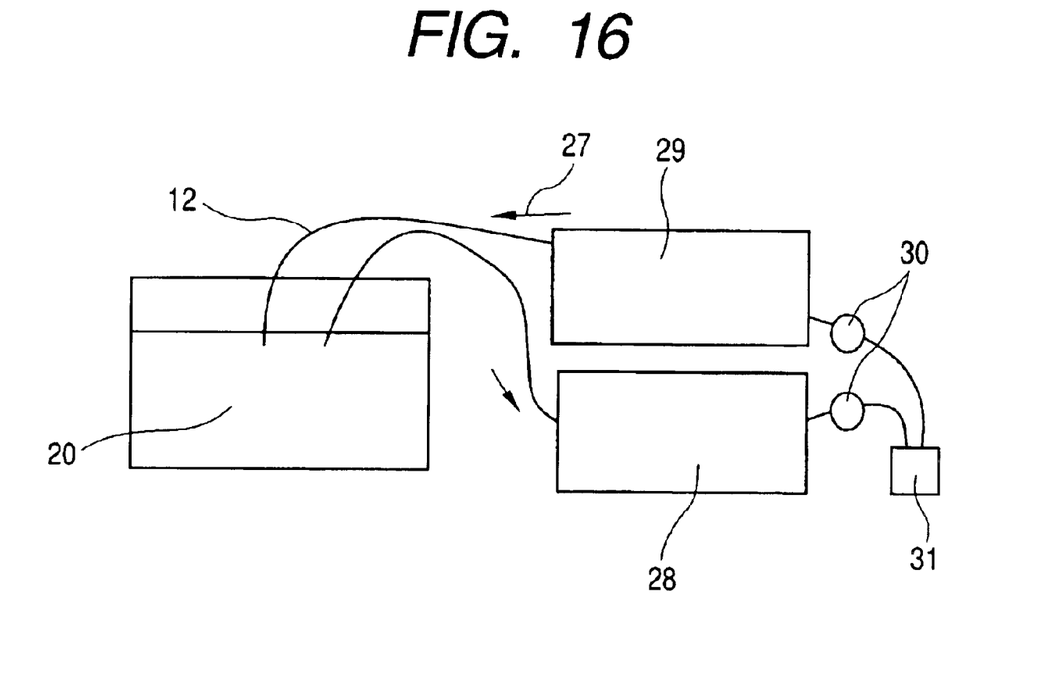
FIG. 16 is an outlook view of a liquid injection jig for use of the reservoir tank mentioned above.

FIG. 16 is a view for briefly explaining the structure of the liquid injection jig for the reservoir tank.

In this FIG. 16, the cooling water is supplied, by means of a supply pump 28, from the fluid region 20 through the flexible tube 12 up to a connector portion 31 with the tank. On the way of this, there is provided a valve 30 for use of liquid removal, and herein working is done for taking-out of the air. Further, the cooling water coming out from the tank turns back to the fluid region 20, again, through a discharge pump 29.

After injecting the water into the reservoir tank, the liquid injection jig is inserted into the reservoir tank, and for example, in the position as shown in FIG. 14, the connector surface 31 with the tank is pushed upon the connection surface 24 of the liquid injection jig, thereby injecting the cooling water into the pipes in the flow direction 27 shown in the figure, and then, the cooling water pushes out the air within the pipes, while filling up within the tank and the pipes. For this reason, with the water-cooling system according to the present invention, it is possible to supply only the cooling water, but not containing the air therein, into the side of the heat-generating element.

Figure 17:
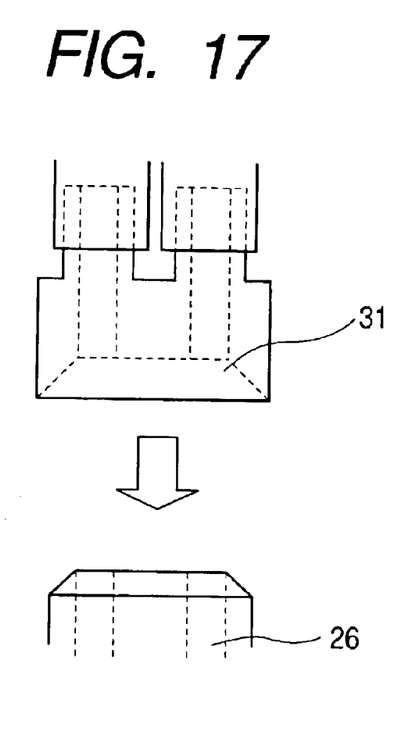
FIG. 17 is a partial enlarged view, for showing the detailed structure of the liquid injection jig for use of the reservoir tank mentioned above.

FIG. 17 is a partial enlarged view for explaining the detailed structure of the liquid injection jig for the reservoir tank mentioned above.

In FIG. 17, both the connector portion 31 with the tank and the inlet/outlet portion 26 of the tank are in a tapered shape; therefore the connection between them can be enhanced in degree of contact or adhesion, due to that between the tapered portions thereof. With this, it is possible to supply the cooling water into the water-cooling system, without causing leakage of the cooling water.

Further, a series of conditions will be shown, during the liquid injection operation into the reservoir tank, by means of the liquid injection jig for the reservoir tank mentioned above, by referring to FIGS. 18 to 21.

Figure 18:
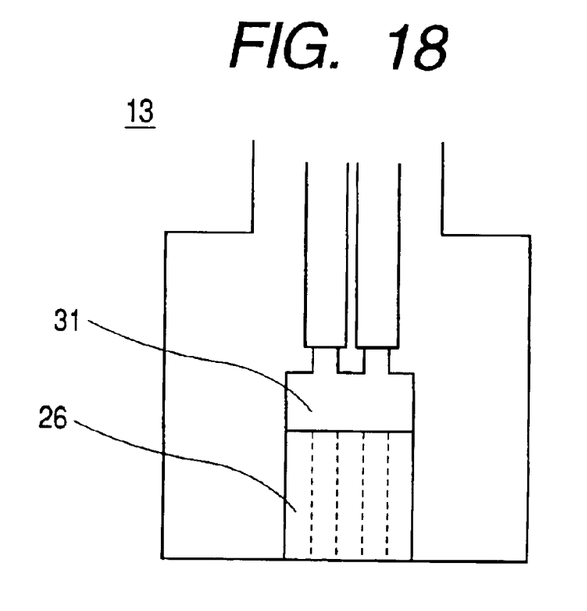
FIG. 18 is a view for showing the condition where the liquid injection jig for the reservoir tank is connected to the reservoir tank.

First of all, FIG. 18 shows the condition where the connector portion 31 with the tank, which is shown in FIG. 17 mentioned above, and the inlet/outlet portion 26 are connected with each other. In this instance, operating the liquid injection jig makes the cooling water flow in the circulation passage within the water-cooling system. And, in this instance, it is necessary to wait for a moment, i.e., until the time when no air comes out therefrom.

Figure 19:
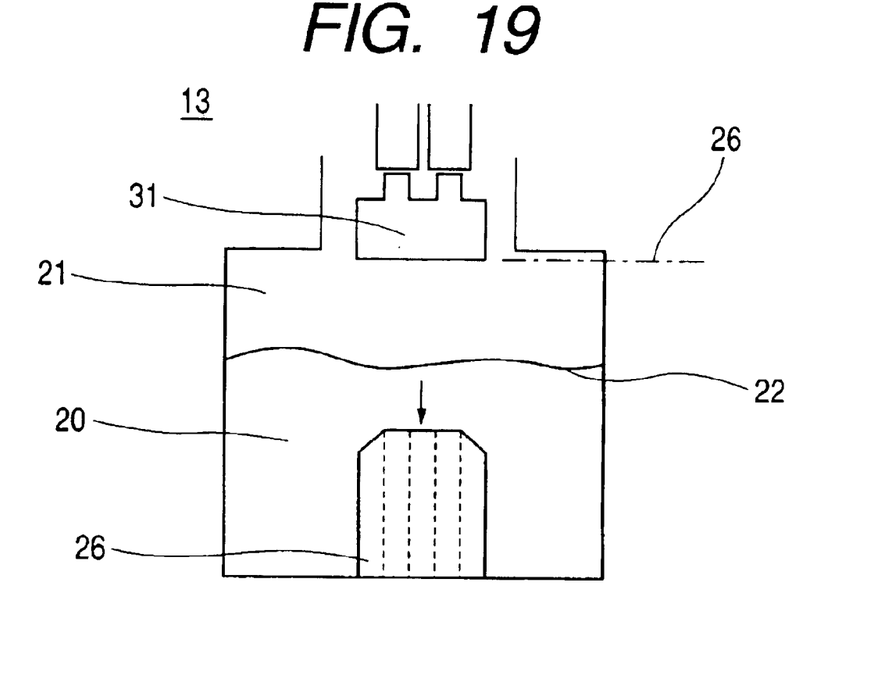
FIG. 19 is a view for showing the condition where the water is supplied or injected into the reservoir mentioned above.

FIG. 19 shows the condition where the cooling water is injected into the reservoir tank.

In this FIG. 19, the connector portion 31 with the tank is moved up to the liquid surface position 26, as a target, and thereafter the cooling water is filled up therein. The cooling water reaching up to this target liquid surface position 26 is discharged out, automatically; therefore no flow-out is caused from the tank. Accordingly, the operation can be performed with safety.

Figure 20:
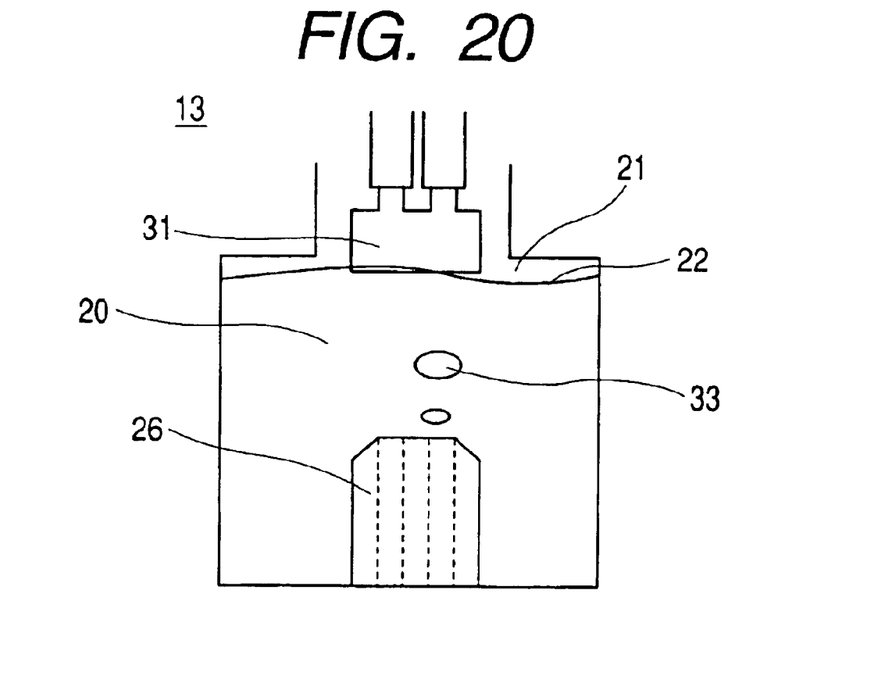
FIG. 20 shows a view for showing the condition of the reservoir tank mentioned above, when a system is operated after the injection of water.

FIG. 20 shows the condition where the system is operated after the liquid injection.

In this FIG. 20, the connector portion 31 with the tank is detached from the inlet/outlet portion, and then the cooling system is operated. With this, it is possible to discharge the air within the pump, completely. Thus, it is possible to supply the cooling water into the cooling system with stability.

Figure 21:
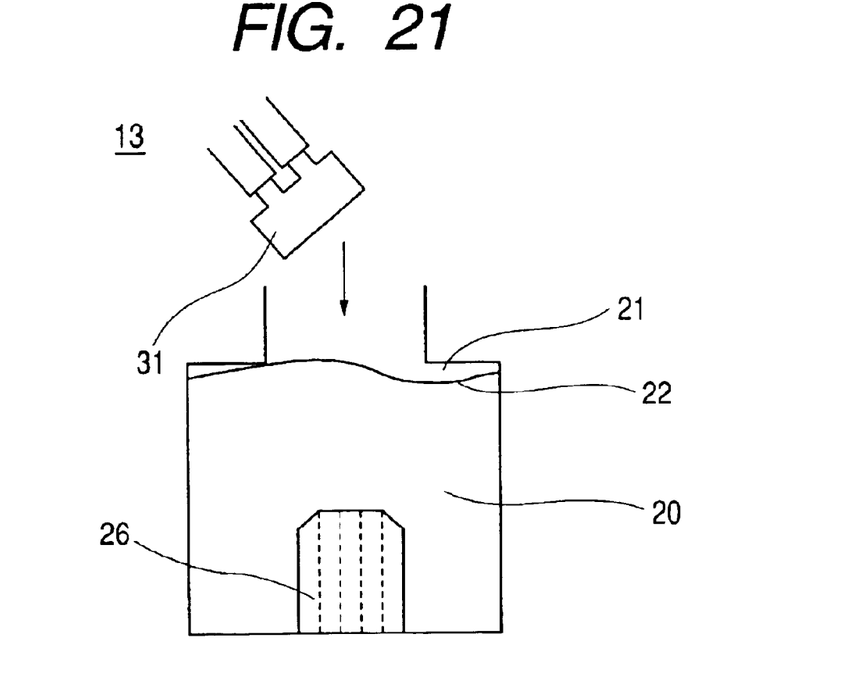
FIG. 21 is a view for showing the condition when the cooling water is discharged from the reservoir tank mentioned above.

FIG. 21 is a view for showing the condition where the cooling water is discharged from the reservoir tank 13.

In FIG. 21, while opening the valve 30 of the liquid injection jig, for use in liquid removal, being explained by referring to FIG. 15 mentioned above, the cooling water accumulated within the tubes is discharged into the reservoir tank 13. With this, it is possible to prevent the cooling water from leaking out when taking off the connector portion 31 with the tank, i.e., the liquid injection jig.

Figure 22:
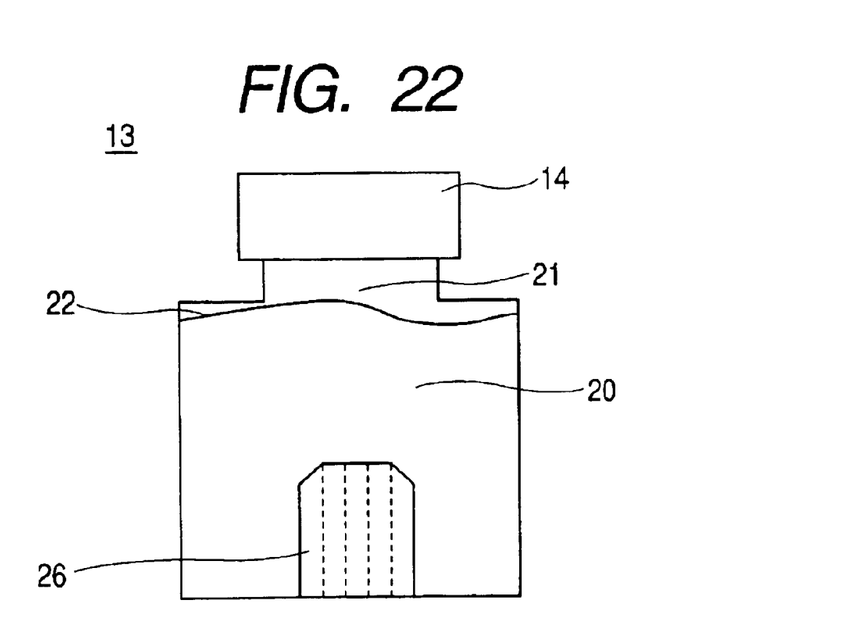
FIG. 22 is a view for showing the condition when conducting a final confirmation, in operations of injecting the liquid into the reservoir tank mentioned above.

FIG. 22 is a view for showing the condition for making final confirmation in the liquid injection operation.

In FIG. 22, it is confirmed that the certain amount of the cooling water is filled up within the reservoir tank 13, and thereafter the cover 14 is closed. With this, the cooling water can be contained fully within the reservoir tank 13, therefore the reservoir tank 13 enables the supply of cooling water into the water-cooling system with a stable flow amount.

As was mentioned in the above, with the water-cooling system for use in the movable electronic equipment or apparatus, according to the present invention, the pipe at the side where the cooling water flows out from the tank is extended up to the position of around the center of the tank and disposed therein, thereby the pipe at the side where the cooling water flow out lies always below the water surface, irrespective of the change or fluctuation on the boundary surface (the water surface) between the cooling water and the air.

Further, with provision of the two (2) pieces of the plates for dividing the vicinity of the inlet portion of the pipe, through which the cooling water flows out, within the tank, the fluctuation on water surface of the cooling water can be reduced, and further, the pipe at which the cooling water flows out lies always below the water surface.

Also, using the injection jig, which has the connector portion with the tank, enables to remove the air mixing into the water-cooling system, when injecting the cooling water into the tank.

As was mentioned, according to the present invention, wherein the pipe at the side where the cooling water flows out is disposed, so that it lies always below the water surface within the tank, it is possible to provide a stable water-cooling system, and further to secure the safe operation of injecting the cooling liquid therein, with enabling to remove the air mixing into the water-cooling system.

Industrial Applicability

As was fully mentioned in the above, according to the present invention, it is possible to provide an electronic equipment or apparatus, being able to circulate/supply a cooling liquid with stability, for dealing with an increase in heat-generation of the heat-generating element, accompanying with an improvement of processing performance of the movable electronic apparatus.

What is claimed is:

1. An electronic apparatus, comprising:
   a case mounting a semiconductor element within an inside thereof;
   a heat-receiving member being thermally connected with said semiconductor element;
   a heat-radiation member disposed on an inner side surface of said casing;
   a liquid driving means for driving a liquid coolant between said heat-radiation member and said heat-receiving member; and
   a tank accumulating said liquid coolant therein with at least a predetermined volume of said coolant to delimit a coolant surface within said tank, wherein said tank, said heat-radiation member and said heat-receiving member are connected with tubes, and
   a suction end portion of a suction pipe connected into said tank is located at a position which is always below the coolant surface irrespective of change of position of said tank.

2. An electronic apparatus according to claim 1, wherein an inside of said tank is partially divided into multiple portions by at least two (2) pieces of partition plates which do not inhibit liquid coolant flow among the multiple portions, and said suction end portion of said suction pipe is located between at least two pieces of the partition plates.

3. An electronic apparatus according to claim 2, wherein a gap is provided between an inner surface of said tank and each of said partition plates, whereby bringing said multiple portions to be communicated with one another.

4. An electronic apparatus according to claim 1, wherein said tube connecting into said tank has a flow inlet and a flow outlet, and a nozzle for injecting said liquid coolant through pushing out air within said tube is able to connect to said flow inlet and said flow outlet.

5. An electronic apparatus according to claim 2, wherein said tube connecting into said tank has a flow inlet and a flow outlet, and a nozzle for injecting said liquid coolant through pushing out air within said tube is able to connect to said flow inlet and said flow outlet.

6. An electronic apparatus according to claim 3, wherein said tube connecting into said tank has a flow inlet and a flow outlet, and a nozzle for injecting said liquid coolant through pushing out air within said tube is able to connect to said flow inlet and said flow outlet.

* * * * *